US010591514B2

(12) United States Patent
Henrard (10) Patent No.: US 10,591,514 B2
(45) Date of Patent: Mar. 17, 2020

(54) CURRENT MEASURING DEVICE PROTECTED AGAINST ELECTRICAL SURGES WHEN OPENING THE CIRCUIT

(71) Applicant: SAFRAN ELECTRICAL & POWER, Blagnac (FR)

(72) Inventor: Pierre Henri Henrard, Blagnac (FR)

(73) Assignee: SAFRAN ELECTRICAL & POWER, Blagnac (FR)

( * ) Notice: Subject to any disclaimer, the term of this patent is extended or adjusted under 35 U.S.C. 154(b) by 41 days.

(21) Appl. No.: 16/071,718

(22) PCT Filed: Jan. 9, 2017

(86) PCT No.: PCT/FR2017/050046
§ 371 (c)(1),
(2) Date: Jul. 20, 2018

(87) PCT Pub. No.: WO2017/125661
PCT Pub. Date: Jul. 27, 2017

(65) Prior Publication Data
US 2019/0033345 A1    Jan. 31, 2019

(30) Foreign Application Priority Data

Jan. 22, 2016    (FR) ..................... 16 50526

(51) Int. Cl.
*G01R 15/18*    (2006.01)
*G01R 1/36*    (2006.01)
(Continued)

(52) U.S. Cl.
CPC ............. *G01R 15/183* (2013.01); *G01R 1/36* (2013.01); *H01F 38/28* (2013.01); *H01F 38/30* (2013.01);
(Continued)

(58) Field of Classification Search
CPC ......... G01R 15/183; G01R 1/36; H01F 38/20; H01F 38/32; H01F 38/28; B64D 2221/00
(Continued)

(56) References Cited

U.S. PATENT DOCUMENTS 4,428,019 A * 1/1984 Howell ................... H02H 3/33
361/113
2012/0050923 A1    3/2012 Fuller et al.
(Continued)

FOREIGN PATENT DOCUMENTS

CN           103762557 A       4/2014
WO    WO 2009/047748 A2       4/2009

OTHER PUBLICATIONS

International Search Report dated Jul. 11, 2017 in PCT/FR2017/050046 filed Jan. 9, 2017.

*Primary Examiner* — Melissa J Koval
*Assistant Examiner* — Rahul Maini
(74) *Attorney, Agent, or Firm* — Oblon, McClelland, Maier & Neustadt, L.L.P.

(57) ABSTRACT

A current measuring device is protected against electrical surges in the event of the device being open circuit. The device includes a first current transformer, a first connection terminal having connected thereto a first terminal of the first current transformer, a second connection terminal having connected thereto a second terminal of the first current transformer, a protective resistance having a first terminal connected to the second connection terminal, and a load resistance connected between the first and second connection terminals across the terminals of which a voltage is measured from which the current flowing in a circuit passing through the first current transformer is determined. The device also includes a second current transformer connected to the terminals of the protective resistance, and current (Continued)

branch connection structure connected between the first connection terminal and a second terminal of the protective resistance.

12 Claims, 8 Drawing Sheets

(51) Int. Cl.
  *H01F 38/28* (2006.01)
  *H01F 38/30* (2006.01)
  *H01F 38/32* (2006.01)
  *G01R 31/00* (2006.01)
(52) U.S. Cl.
  CPC ......... *H01F 38/32* (2013.01); *B64D 2221/00* (2013.01); *G01R 31/008* (2013.01); *H01F 2038/305* (2013.01)
(58) Field of Classification Search
  USPC .......................................................... 324/127
  See application file for complete search history.

(56) References Cited

U.S. PATENT DOCUMENTS

2015/0091558 A1\* 4/2015 Epps ...................... G01R 15/18
  324/251
2015/0333509 A1 11/2015 Jankowski \* cited by examiner

CURRENT MEASURING DEVICE PROTECTED AGAINST ELECTRICAL SURGES WHEN OPENING THE CIRCUIT

BACKGROUND OF THE INVENTION

The invention relates to the general field of current measuring instruments, and more particularly to current transformers for fitting on board an aircraft.

The use of current transformers (CT) is common practice in aviation on alternating current (AC) networks operating at 115 volts AC (VAC) or at 230 VAC. CTs are used to measure AC line currents in airplane networks, which are generally three-phase AC networks.

Figure 1:
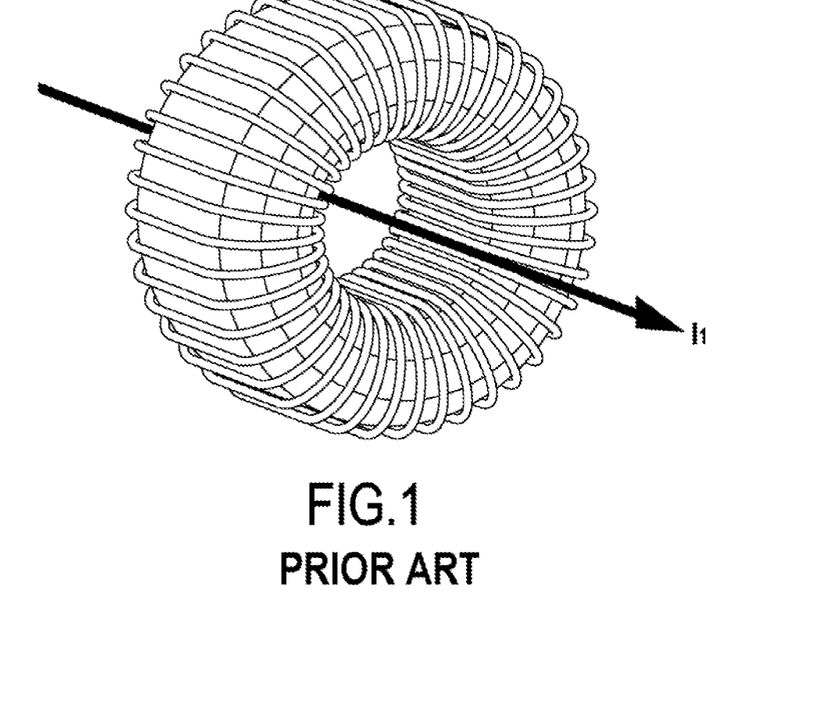
FIG. 1, described above, is a simplified perspective view of a prior art current transformer.

As shown in FIG. 1, a CT is constituted by a magnetic circuit, which is generally in the form of a torus in order to minimize magnetic leakage, and which has a number n of secondary turns wound thereon that are looped via a load resistance. Those turns carry a current written $I_2$. The current, written $I_1$, that is to be measured in the busbar passes through the resulting torus at least once. In the example described herein and as shown in particular in FIG. 2, which is a simplified electrical circuit diagram of a CT, it is assumed that the number of primary turns is equal to one (as is usual in aviation).

A CT complies with Ampere's law, which is written mathematically by the following equation:

$$\oint \vec{H} d\vec{l} = -I_1 + nI_2$$

where $I_1$ is the current to be measured passing through the torus, $I_2$ corresponds to the measurement current obtained by winding n turns around the magnetic core, and H is the magnetic field used for magnetizing the torus.

Ignoring any circulation of the magnetic field in the core, i.e. assuming $$\oint \vec{H} d\vec{l} = 0,$$

then the following relationship is obtained: $I_1 = nI_2$.

Figure 2:
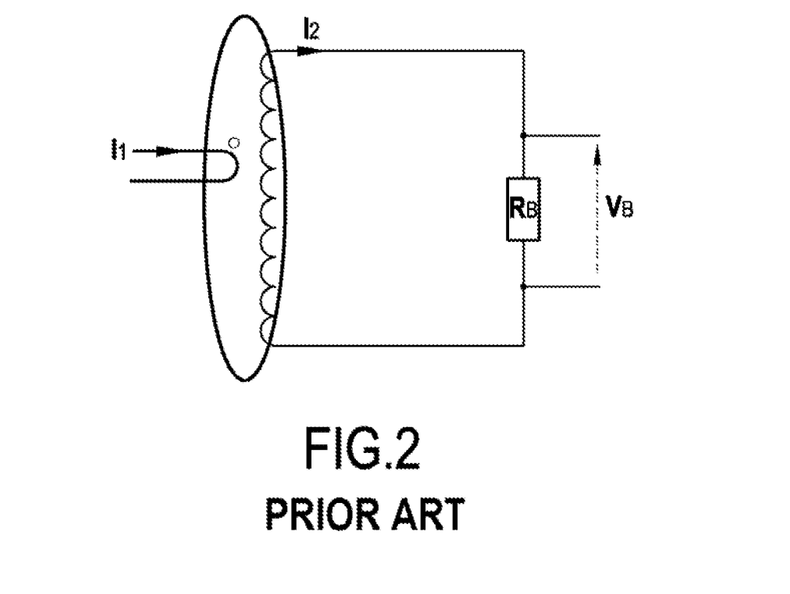
FIG. 2, described above, is an electrical circuit diagram of a simplified model of a current measuring device having a current transformer of the kind known in the prior art.

The secondary circuit is loaded by a load resistance, written $R_B$ in FIG. 2, which makes it possible, by measuring the voltage across the terminals of the load resistance, to deduce the voltage $V_B$ across the secondary of the torus, which is given by $$V_B = R_B I_2 = R_B \frac{I_1}{n},$$

ignoring magnetizing current, and thus to determine the current $I_1$ flowing in the busbar passing through the torus.

CTs thus present the advantage of being capable of taking a measurement that is relatively insensitive to the electromagnetic environment within the airplane and transmitting it to the control and protection members, referred to respectively as the general control unit (GCU) and the bus power control unit (BPCU). CTs can thus easily be remote from the decision-taking members, being spaced apart from them by a few tens of centimeters to several tens of meters on board an airplane.

Nevertheless, using CTs raises a problem. When a CT is open circuit (no load resistance), i.e. when the connection between the CT and its receiver, a CGU or a BPCU or even some other member, is interrupted, then a high voltage is generated at the output from the secondary windings of the CT. Specifically, the lack of current flowing in the secondary leads to equality between the primary current and the circulation of the magnetizing field used for magnetizing the torus. This gives $$\oint \vec{H} d\vec{l} = -I_1.$$

Since the amplitude of the primary current that is to be measured is generally quite high, the induction B in the magnetic circuit becomes saturated very quickly each time the primary current reverses. By applying Lenz's law to the secondary of the CT, $V = n d\varphi/dt$, where $\varphi$ is the electromagnetic flux exchanged between the primary and secondary, it is found that the voltage takes on values that are very large on each sudden change in the magnetizing current. This voltage depends on the number of secondary turns, on the type of the magnetic core, and also on the value of the primary current that is to be measured.

This high voltage, which depends on the value of the measured current, can easily exceed several kilovolts. It can lead to electric arcs being struck at the output from the CT, or even within its windings. The triggering of such phenomena thus depends on the level of current flowing in the lines that are to be measured, and also on the magnetic material used for the CT and on its number of secondary turns.

In an airplane this can lead to non-negligible risk, since these phenomena continue to be maintained so long as they have not been detected, and they can give rise to a fire.

There exist three main types of protection families for protecting CTs: protection by adding a bidirectional peak-limiter; protection by adding a resistance in parallel with the output of the CT; and protection by adding a capacitor.

Figure 3:
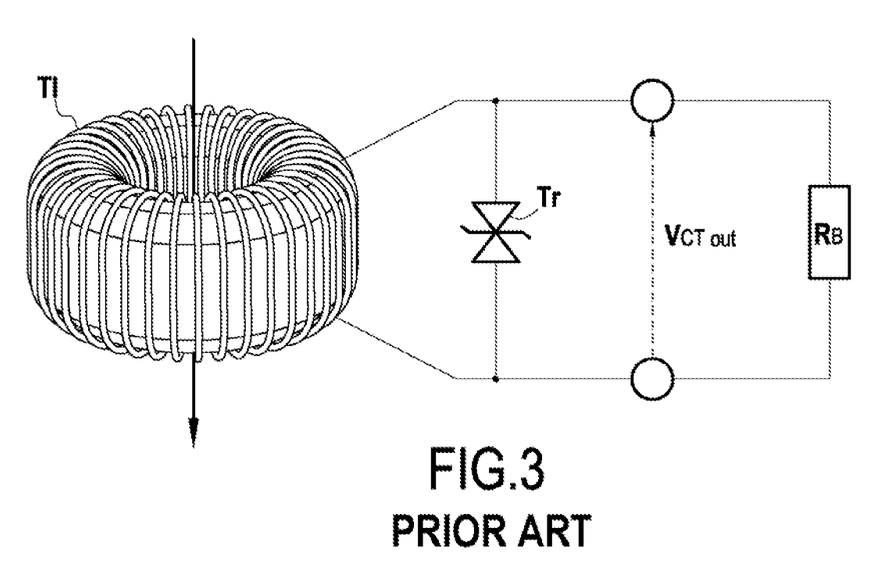
FIG. 3, described above, is a diagram showing a prior art current measuring device having a current transformer with protection by means of a peak-limiter.

As shown in FIG. 3, protection by means of a peak-limiter is obtained by connecting a peak-limiter, e.g. such as a tranzorb, between the two outputs of the CT. The peak-limiter is set to a voltage higher than the maximum voltage $V_{CT\_out}$ to be measured across the terminals of the load resistance $R_B$. When the CT is open circuit, the power dissipated by the peak-limiter may be written as follows:

$$\langle P \rangle = \frac{V_T}{n\pi} I_{primary\_rms} \sqrt{2} \, (1 - \cos(\omega \Delta t))$$

With $$\Delta t = nS \frac{\Delta B_{cc}}{V_T} = f(V_T),$$

and where $V_T$ represents the peak-limiting voltage, $\Delta t$ the duration of peak-limiting, $\omega$ the angular frequency of the electrical power network, S the effective cross-sectional area of the magnetic material, $\Delta B_{cc}$ the maximum peak-to-peak induction of the magnetic material, n the number of secondary turns, and $I_{primary\_rms}$ the primary root mean square (rms) current for which it is desired to protect the CT.

Figure 4:
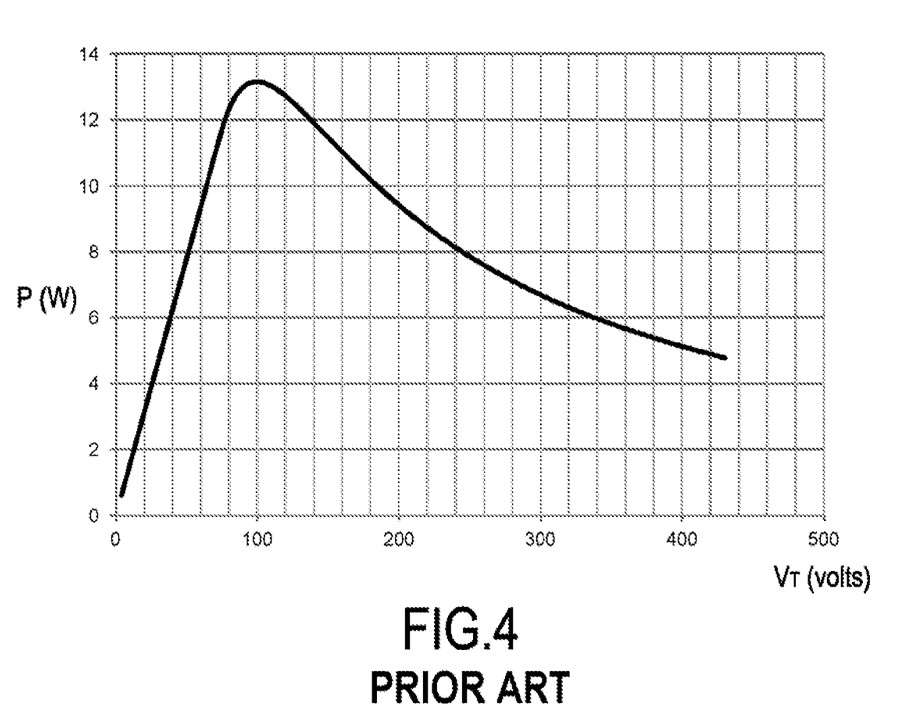
FIG. 4, described above, is a graph showing the power dissipated by the peak-limiter type protection of FIG. 3 as a function of the peak-limiting voltage when using a current transformer having 1000 secondary turns for a defined nominal primary current.

As can be seen in FIG. 4, losses depend on the peak-limiting voltage, and also on the primary current, on the number of turns, on the cross-section of the core, and on the level of saturation of the magnetic material.

For an application on a three-phase network operating at 90 kilovolt amps (kVA) and 400 hertz (Hz), the peak limiting voltage should generally be selected to be greater than 40 volts (V). Thus, if the losses of the CT (ignoring the iron losses of the core) are estimated, then the following distribution is to be found: 0.36 watts (W) for copper losses in the secondary, and 6.25 W for the peak-limiter type protection. Given the very large losses for the peak-limiter type protection, a heatsink must be provided to evacuate the power dissipated by this protection, since the peak-limiter runs the risk of not withstanding the temperature.

Figure 5:
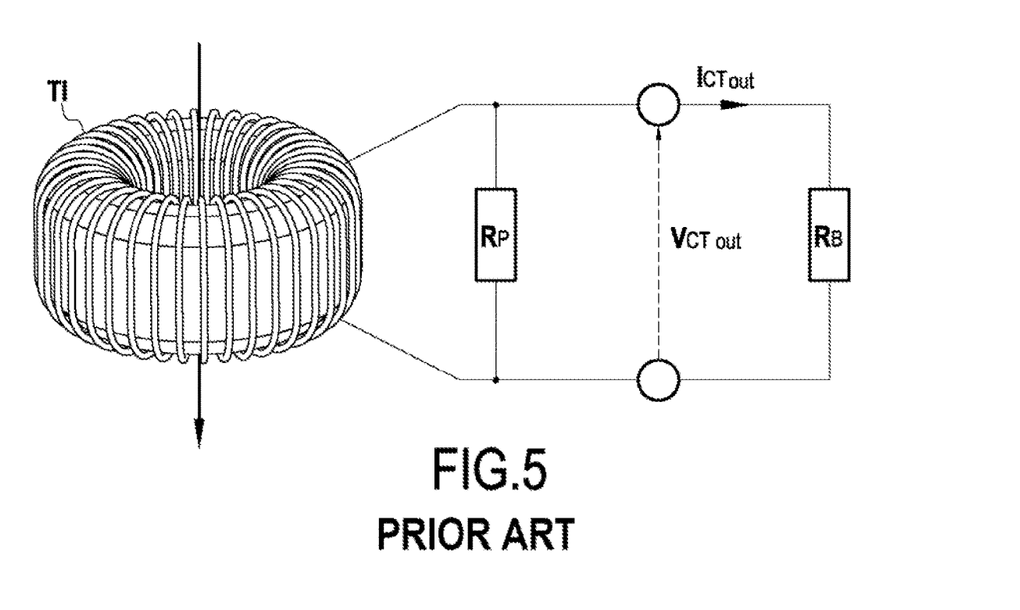
FIG. 5, described above, is a diagram showing a prior art current measuring device having a current transformer with protection by means of a protective resistance.
Figure 6:
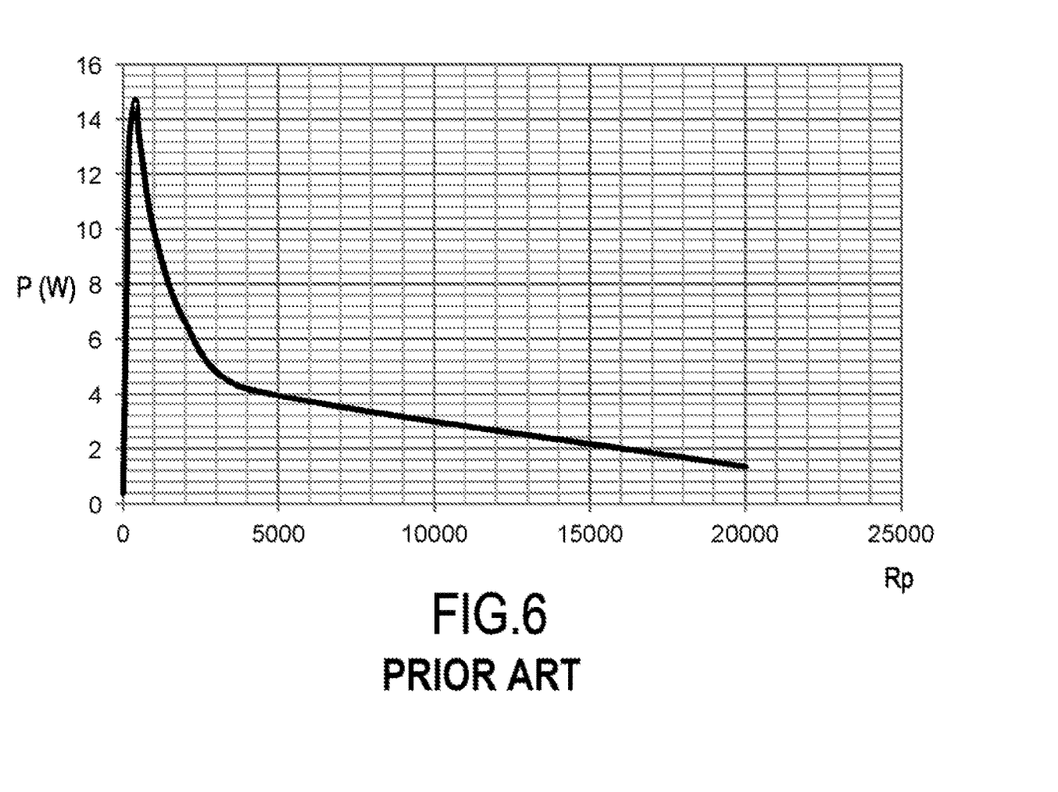
FIG. 6, described above, is a graph showing the power dissipated by the resistance type protection of FIG. 5 as a function of the peak-limiting voltage when using a current transformer having 1000 secondary turns for a defined nominal primary current.

As shown in FIG. 5, the circuit conventionally used for providing protection by adding a resistance in parallel with the output of the CT comprises: the CT; a load resistance $R_B$ for measurement purposes; and a resistance $R_p$ connected in parallel with the load resistance $R_B$ at the output from the CT. The losses in the parallel resistance $R_p$ as a function of its resistance value are given by the curve in FIG. 6. This curve was obtained from a digital simulation model.

Figure 7:
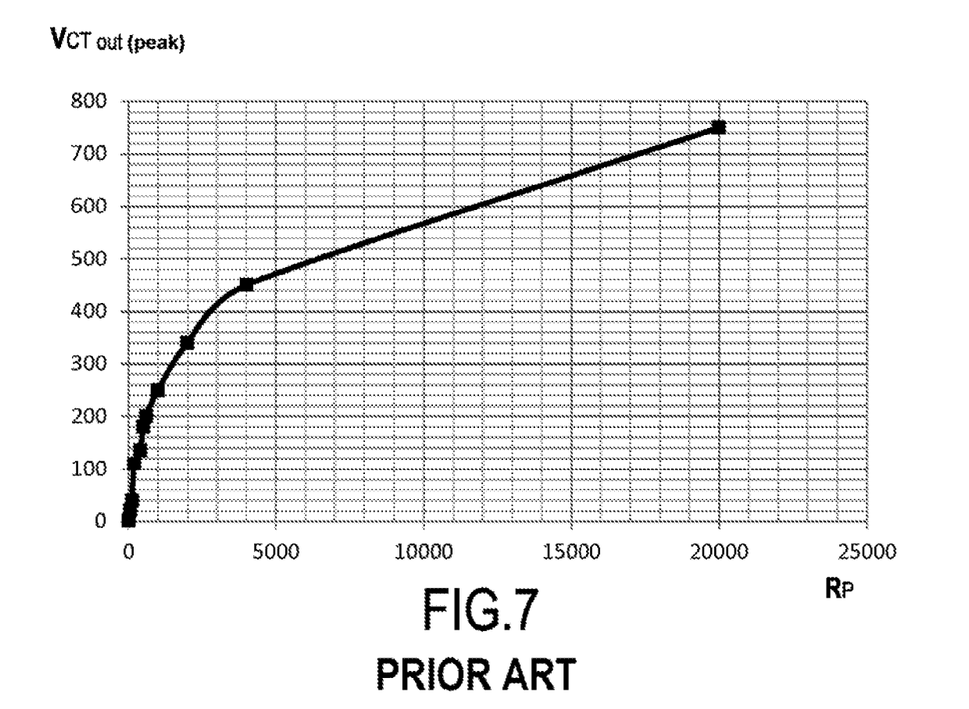
FIG. 7, described above, is a graph showing the output voltage of the FIG. 5 current transformer when unloaded as a function of the parallel resistance when the load resistance is disconnected.

As shown by the curve in FIG. 7, when the parallel resistance Rp is too high, losses are reduced, however the peak voltage is attenuated very little. In contrast, when the resistance is very low, i.e. of the order of no more than about 100 ohms, losses are low and the output voltage is limited, but under such circumstances, accuracy is not very high. Specifically, the measured current then depends on the line impedance, which has a value that cannot be known with great accuracy.

The current $I_{CTout}$ flowing in the measurement resistance may be expressed as a function of the input primary current:

$$I_{CTout} = \frac{i_1}{n} \frac{R_p}{(R_p + R_B + R_l)}$$

It should be observed that the error concerning the measured current is of the same order of magnitude as the sum of the accuracies relating to the resistances $R_p$, $R_l$, and $R_B$. Although $R_B$ and $R_p$ can be accurate, $R_l$ is subject to inaccuracy concerning knowledge about the length of the line.

Figure 8:
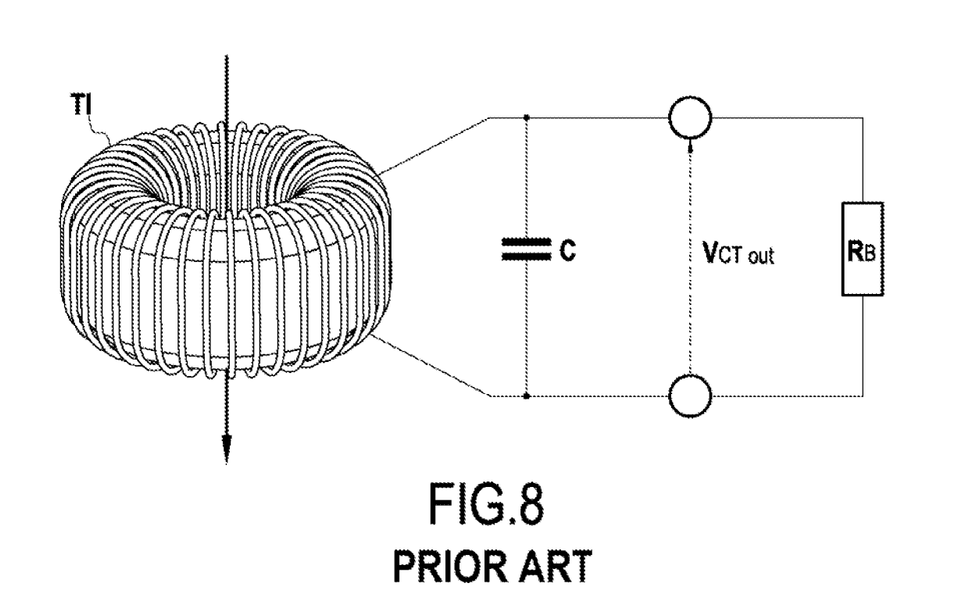
FIG. 8, described above, is a diagram showing a prior art current measuring device having a current transformer with protection by means of a protective capacitor.

As shown in FIG. 8, the circuit conventionally used for providing protection by adding a capacitor comprises: the CT; a load resistance $R_B$; and a capacitor C connected in parallel with the output of the CT.

For this type of protection, it is necessary to choose an appropriate value for the capacitance of the capacitor. In order to determine the optimum value for the capacitance, it is considered that when the load resistance $R_B$ is disconnected, the output voltage must be less than the saturation voltage for a given rms current $I_{1rms}$ flowing in the primary turn (in general the nominal primary current).

Figure 9:
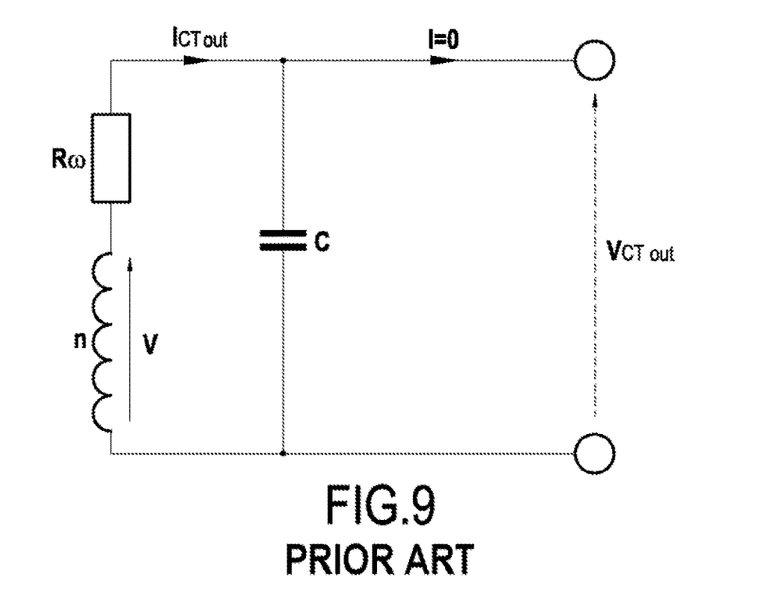
FIG. 9, described above, is an electrical circuit diagram of a model equivalent to the FIG. 8 current transformer.

An equivalent model is set up as shown in FIG. 9 in which the current $I_C$ flowing in the capacitor is equal to $I_1(t)/n$, with n being the number of secondary turns in the CT, and including a resistance $R_\omega$ corresponding to the resistance of the secondary winding.

The current $I_C$ flowing through the capacitance is then given by:

$$I_C = C \frac{dV_{CTout}}{dt}$$

Where C is the capacitance of the capacitor and $V_{CTout}$ is the voltage across the terminals of the CT, and thus across the terminals of the capacitor.

The voltage across the terminals of the windings is given by:

$$V = V_{CTout} + R_\omega I_{CTout} = \frac{1}{C}\int I_{CTout} dt + R_\omega I_{CTout}$$

With $I_{CTout}$ being the current delivered by the CT, i.e. in the equivalent model, the current flowing in the winding and the resistance $R_\omega$ of the secondary winding.

The current flowing in the capacitance can also be expressed as a function of the primary current $I_{1rms}$.

$$I_{CTout} = \frac{I_{1rms}}{n} \sqrt{2} \sin(\omega t)$$

Thus, under sinusoidal conditions, this gives:

$$V = \left(-j\frac{1}{C\omega} + R_\omega\right) I_{CTout}$$

From which it can be deduced:

$$V = \sqrt{\left(\frac{1}{(C\omega)^2} + R_\omega^2\right)} \|I_{CTout}\| = \sqrt{\left(\frac{1}{(C\omega)^2} + R_\omega^2\right)} \frac{I_{1rms}}{n} \sqrt{2}$$

By writing Lentz's law as follows:

$$V = n\frac{d\varphi}{dt} = nS\frac{dB}{dt}$$

likewise under sinusoidal conditions:

$$\|V\| = nS\omega\|B\|$$

It can be deduced therefrom that:

$$nS\omega\|B\| = \sqrt{\left(\frac{1}{(C\omega)^2} + R_\omega^2\right)} \frac{I_{1rms}}{n} \sqrt{2}$$

Which can be developed as follows:

$$\frac{n^2 S\omega\|B\|}{I_{1rms}\sqrt{2}} = \sqrt{\left(\frac{1}{(C\omega)^2} + R_\omega^2\right)}$$

$$\left(\frac{n^2 S\omega\|B\|}{I_{1rms}\sqrt{2}}\right)^2 = \left(\frac{1}{(C\omega)^2} + R_\omega^2\right)$$

$$\frac{1}{(C\omega)^2} = \left(\frac{n^2 S\omega\|B\|}{I_{1rms}\sqrt{2}}\right)^2 - R_\omega^2$$

$$C = \frac{1}{\omega} \sqrt{\frac{1}{\left(\frac{n^2 S \omega \|B\|}{I_{1rms}\sqrt{2}}\right)^2 - R_\omega^2}}$$

The capacitance actually selected should be greater than the above-determined value in order to avoid saturation of the magnetic core.

$$C > \frac{1}{\omega} \sqrt{\frac{1}{\left(\frac{n^2 S \omega B_{max}}{I_{1rms}\sqrt{2}}\right)^2 - R_\omega^2}}$$

The major drawback of this solution is that it is difficult to use for providing differential protection. Specifically, in the event of a short circuit, the capacitor currents can be identified by the differential protection as being a differential fault current.

Other kinds of protection also exist that generally make use of active electronics, thereby reducing the overall reliability of the current measuring device including the CT. That is why this type of protection is not used.

Adding protection, such as resistances, for example, to the CT generally leads to a loss of accuracy in the final output measurement. This loss of accuracy then gives rise to a need to raise the fault detection thresholds, in particular for differential faults.

Furthermore, such protection is generally not capable of withstanding a permanent fault. It can thus likewise lead to overheating and starting a fire.

OBJECT AND SUMMARY OF THE INVENTION

The invention seeks to provide effective protection for protecting both operators and also a current measuring device that includes a current transformer, while conserving accuracy that is sufficient to satisfy the requirements of aircraft manufacturers.

For this purpose, the invention provides a current measuring device that is protected against electrical surges in the event of the circuit of said device being open circuit, the device comprising a first current transformer, a first connection terminal having connected thereto a first terminal of the first current transformer, a second connection terminal having connected thereto a second terminal of the first current transformer distinct from said first terminal of the first current transformer, a protective resistance having a first terminal connected to the second connection terminal, and a load resistance connected between the first and second connection terminals across the terminals, of which a voltage is measured from which the current flowing in a circuit passing through the first current transformer is determined.

According to a general characteristic of the invention, the measuring device comprises a second current transformer connected to the first and second terminals of the protective resistance, and current branch connection means connected between said first connection terminal and the second terminal of the protective resistance.

The present invention makes it possible to compensate for the loss of accuracy due to adding protection against electrical surges of resistive or capacitive type while, in the event of the CT going open circuit, eliminating any risk of generating a dangerous high voltage. Specifically, the voltage that is generated is a voltage that is not destructive for the CT and that is low enough not to electrocute an operator (V<40V).

The measuring device of the invention can be implemented on any equipment on board an airplane that is not easy to access, such as for example nacelle-mounted generators, thereby avoiding any dismantling and repair in a factory as a result of an open circuit fault in the secondary of the CT.

The accuracy that is obtained by the present invention enables the device to be compatible with the needs of an airplane for which differential fault detection levels must be very low, i.e. of the order of about ten amps, e.g. as in a "carbon-fiber" airplane.

The present invention also provides lower losses when the circuit is open circuit compared with a prior art solution making use merely of a parallel connected peak-limiter. The invention thus makes it possible to withstand greater current overloads in the event of a fault.

The load resistance or measurement resistance may correspond to the internal resistance of measurement means coupled between the first and second connection terminals of said current measuring device.

In a first aspect of the current measuring device that is protected against electrical surges in the event of going open circuit, the protective resistance may possess a resistance value corresponding, to within 20% and more particularly to within 10%, to the sum of the resistance value of the load resistance plus the resistance value of the line impedance corresponding to the resistance of the electric line coupling the load resistance to the first and second connection terminals.

In this configuration, the potential at the first connection terminal is identical or nearly identical to the potential at the second terminal of the protective resistance to which the capacitor and the second current transformer are connected. The two terminals of the capacitor thus take up potentials that are identical or nearly identical so no, or practically no, current flows through the branch connection means in nominal operation, i.e. so long as the CT is not open circuit.

Consequently, all of the current delivered by the first current transformer is transmitted to the load resistance, thereby improving the accuracy with which current is measured.

In a second aspect of the current measuring device protected against electrical surges in the event of going open circuit, the first and second current transformers are preferably identical magnetic toruses possessing in particular the same magnetic cores and the same number of turns.

The toroidal shape of the current transformer serves to minimize magnetic leakage.

Having identical current transformers makes it possible to have identical currents delivered at the output of the two magnetic toruses, thus making it possible to minimize or even eliminate any interfering current passing through the current branch connection means.

In a third aspect of the current measuring device protected against electrical surges in the event of going open circuit, the current branch connection means may comprise a capacitor.

In a variant, the current branch connection means may comprise peak-limiter means such as a tranzorb.

In another variant, the current branch connection means may comprise a parallel connection having a first branch with a number k of diodes connected in series to conduct in a first direction and a second branch comprising the same number k of diodes connected in series to conduct in a second direction opposite to the first direction.

In yet another variant, the current branch connection means may comprise a series connection of two zener diodes connected opposite ways round.

In a fourth aspect of the current measuring device protected against electrical surges in the event of going open circuit, the device may further comprise a fault detection device for detecting a fault in the current measuring means for measuring the voltage across the terminals of the load resistance.

Thus, for applications that do not require differential protection, such as for example measuring currents on ground power units, the measuring device makes it possible to avoid any problem associated with the secondary circuit going open circuit, while avoiding a hidden fault in the "current measuring function". The fault detector device can be quite simple and can be implemented in the measurement electronics. The fault detector device may for example include a pull-up resistance connected to the load resistance.

The invention also provides a three-phase measurement system for measuring current flowing in the three phases of a three-phase circuit, the system comprising three measuring devices as defined above, the second connection terminals of the devices being connected together.

The invention also provides an aircraft including at least one current measuring device as defined above.

BRIEF DESCRIPTION OF THE DRAWINGS

The invention can be better understood on reading the following description given by way of nonlimiting indication and with reference to the accompanying drawings, in which.

DETAILED DESCRIPTION OF EMBODIMENTS

Figure 10:
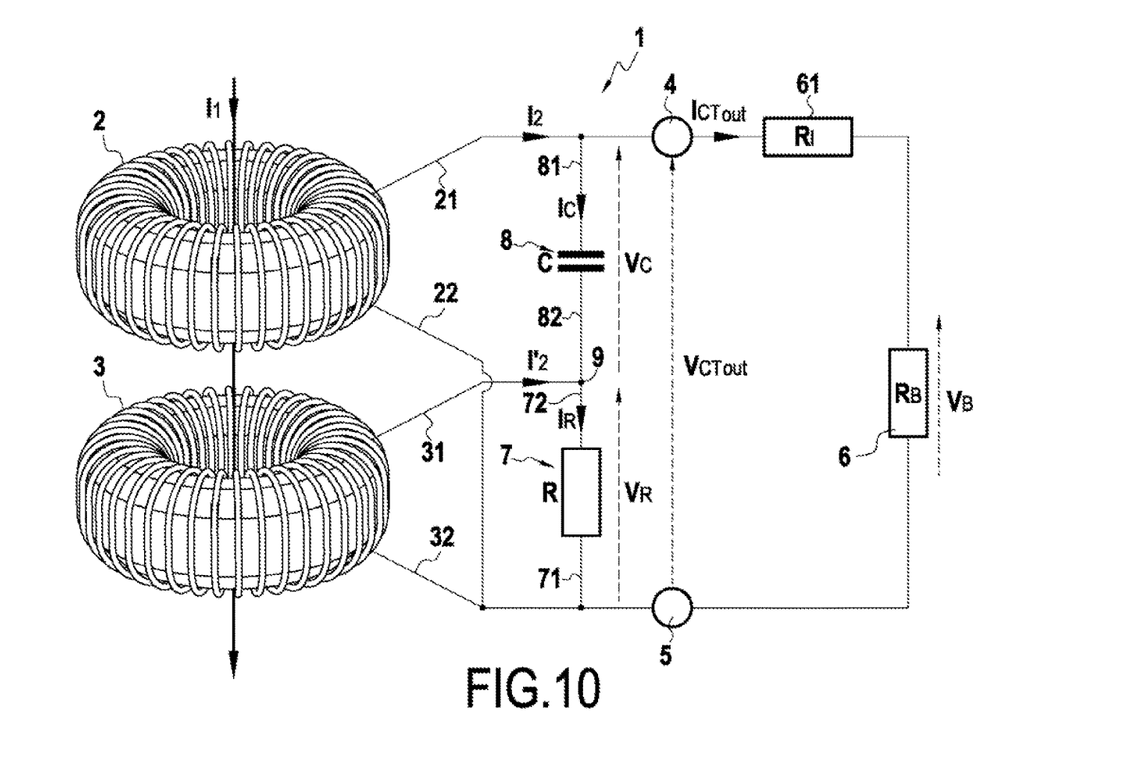
FIG. 10 is a schematic diagram of a current measuring device in a first embodiment of the invention.

In FIG. 10, there is shown an electrical circuit diagram of a current measuring device in a first embodiment of the invention.

The current measuring device 1 comprises a first current transformer in the form of a magnetic torus 2 possessing a first number $N_1$ of loops, i.e. of turns, and a second current transformer in the form of a magnetic torus 3 possessing a second number $N_2$ of loops equal to the first number $N_1$ of loops. The cores of the first magnetic torus 2 and of the second magnetic torus 3 are made of the same material and they have the same dimensions. Thus, the first and second magnetic torus 2 and 3 are identical.

The first magnetic torus 2 presents a first coupling terminal 21 and a second coupling terminal 22. The second magnetic torus 3 presents a first coupling terminal 31 and a second coupling terminal 32.

The current measuring device 1 also comprises a first connection terminal 4 and a second connection terminal 5, together with a load resistance 6 connected between the first and second connection terminals 4 and 5. The load resistance 6 makes it possible to measure a voltage in order to determine the current flowing in a circuit passing through the first magnetic torus 2.

The first connection terminal 4 is also connected to the first coupling terminal 21 of the first magnetic torus 2, while the second connection terminal 5 is also connected to the second coupling terminal 32 of the second magnetic torus 3 and to the second coupling terminal 22 of the first magnetic torus 2.

The current measuring device 1 also has a protective resistance 7 and the current branch connection means that are formed in the first embodiment shown in FIG. 10 by a capacitor 8.

The protective resistance 7 presents a first terminal 71 connected to the second connection terminal 5, and a second terminal 72 connected to the first coupling terminal 31 of the second magnetic torus 3.

The capacitor 8 presents a first terminal 81 connected to the first connection terminal 4, and a second terminal 82 connected to the first coupling terminal 31 of the second magnetic torus 3, and thus to the second terminal 72 of the protective resistance 7.

The interconnection node formed by connecting together the first coupling terminal 31 of the second magnetic torus 3, the second terminal 72 of the protective resistance 7, and the second terminal 82 of the capacitor 8 is given numerical reference 9.

In nominal operation, the first magnetic torus 2 generates a first current $I_2$, referred to as the "measurement current", and the second magnetic torus 3 generates a second current $I_2'$. The second current $I_2'$ is injected essentially into the protective resistance 7. Since the first and second magnetic toruses 2 and 3 are identical and since they have the same circuit passing through them carrying the current $I_1$ that is to be measured, the first and second currents $I_2$ and $I_2'$ are identical or nearly identical.

The protective resistance 7 is selected to be equal to, or to have a value that is as close as possible to, the sum of the load resistance 6 plus the line impedance, represented in the circuit diagram by a resistance 61.

Because the first current $I_2$ and the second current $I_2'$ are equal, and because the protective resistance 7 and the sum of the load resistance plus the line impedance 61 are equal, it is possible to have a voltage $V_R$ across the terminals 71 and 72 of the protective resistance 7 that is equal to the measured voltage $V_{CTout}$ between the first connection terminal 4 and the second connection terminal 5. Since the potential at the interconnection node 9 is equal to, or very nearly equal to, the potential of the first connection terminal 4, the voltage $V_C$ across the terminals 81 and 82 of the capacitor 8 is zero or almost zero, and thus the current $I_C$ passing through the capacitor is likewise zero or almost zero.

This thus makes it possible to minimize, or even to eliminate, interfering capacitive current $I_C$ passing through the capacitor 8 during nominal operation of the current measuring device 1, where nominal operation corresponds to operating in a closed circuit making it possible to measure the current $I_1$ of the circuit passing through the first and second magnetic toruses 2 and 3.

The line impedance 61 can be considered as being the resistance of the wire both between the first connection terminal 4 and the load resistance 6, and also between the load resistance 6 and the second connection terminal 5. Specifically, the impedance due to the inductance of the wiring is negligible compared with the resistance of the wire.

Assuming that it is possible to know the line resistance with a certain amount of tolerance of the order of 10% to 20%, and that the load resistance can be known with tolerance that is less than or equal to 1%, it is possible to determine the maximum measurement error generated by the current measuring device 1.

In the event of the load resistance 6 becoming disconnected, the measurement current $I_2$ of the current measuring device 1 passes in full through the capacitor 8. The current $I_R$ flowing through the protective resistance is then doubled.

The output current $I_{CTout}$ delivered at the output from the first connection terminal 4 to the load resistance 6 can be expressed as a function of the input primary current $I_1$, i.e. as a function of the current in the circuit passing through the first and second magnetic toruses, and ignoring the magnetizing current.

This gives the following equations:

$$\begin{cases} i'_2 = xi_2 & (1) \\ V_C + V_R = V_{CTout} & (2) \\ i_C = i_2 - i_{CTout} & (3) \\ i_R = i_2 + i'_2 - i_{CTout} & (4) \\ i_C = jC\omega V_C & (5) \\ i_R = \dfrac{V_R}{R} & (6) \\ i_{CTout} = \dfrac{V_{CTout}}{(R_l + R_B)} & (7) \end{cases}$$

Where R is the value of the protective resistance 7, $R_l$ is the value of the line impedance 61, $R_B$ is the value of the load resistance 6, C is the value of the capacitance of the capacitor 8, and x corresponds to the ratio of the number of turns of the two toruses (x=N1/N2) given that in theory N1=N2.

From this system of equations, the following transfer function can be obtained:

$$\frac{i_{CTout}}{i_2} = \frac{1 + jRC\omega(1+x)}{(1 + j(R_l + R_B + R)C\omega)}$$

The ratio of the moduluses is written as follows:

$$\frac{\|i_{CTout}\|}{\|i_2\|} = \frac{\sqrt{(1 + (RC\omega(1+x))^2)}}{\sqrt{(1 + ((R_l + R_B + R)C\omega)^2)}}$$

And the phase difference is given by:

$$\varphi = \operatorname{Arctan}(RC\omega)(1+x)) - \operatorname{Arctan}((R_l + R_B + R)C\omega)$$

The current $I_C$ flowing through the capacitor is written as follows:

$$i_C = i_2 - i_{CTout} = \frac{i_1}{n}\left(1 - \frac{1 + jRC\omega(1+x)}{(1 + j(R_l + R_B + R)C\omega)}\right)$$

I.e.: $i_C = \dfrac{i_1}{n}\left(\dfrac{(j(R_l + R_B - xR)C\omega)}{(1 + j(R_l + R_B + R)C\omega)}\right)$ Knowledge of this interfering current $i_c$ makes it possible to set the differential protection threshold.

Figure 11:
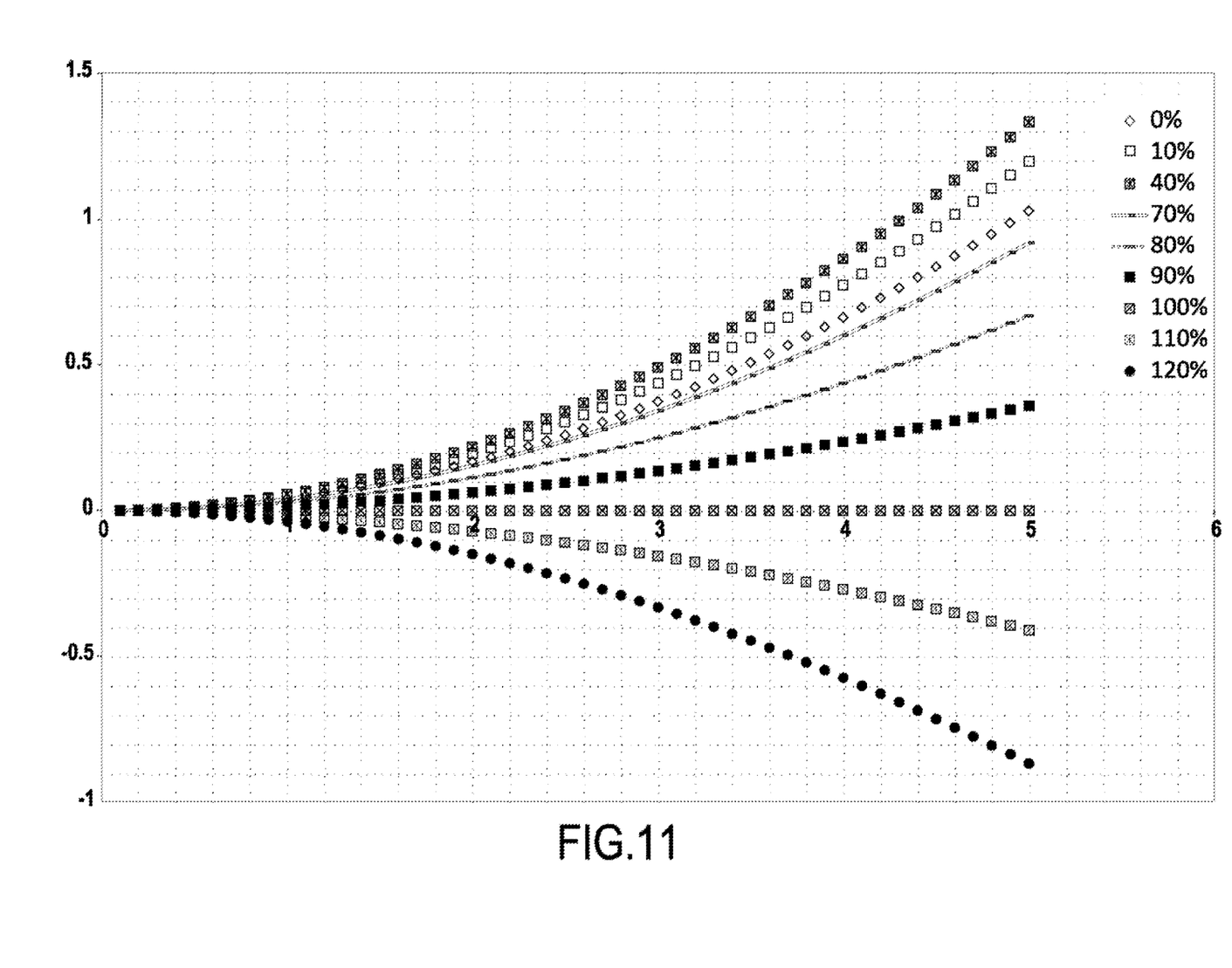
FIG. 11 is a graph showing the error x made in measuring the primary current for various values of the protective resistance in the FIG. 10 current measuring device.

FIG. 11 shows a set of curves plotting along the ordinate axis the error percentage concerning measurements of the primary current $I_1$ for different values of R, satisfying the relationship $R=y(R_l+R_B)$, for the protective resistance 7 of the current measuring device 1, where $R_l$ has a value of 8.5 ohms (Ω) and $R_B$ has a value of 3Ω. The capacitance of the capacitor in microfarads is plotted along the abscissa. Each curve shows the error percentage as a function of the capacitance for a different value of y. The value of y is expressed as a percentage in the legend in the FIG. (0%, 10%, 40%, 70%, 80%, 90%, 100%, 110%, 120%). The curve with y=0% corresponds to the representation for a circuit that does not have a resistance 7 (value of R is zero). Furthermore, in this set of curves, the value of the ratio x of the number of turns in the two toruses was set to 1, which means that the number of turns in both magnetic toruses 2 and 3 is equal.

It can be observed that starting from the coefficient y having a value of 60% (y=0.6), the current measuring device 1 in the first embodiment of the invention minimizes the measurement error compared with a solution known in the prior art using a current transformer and a single capacitor, corresponding to the curve with y=0.

Figure 12:
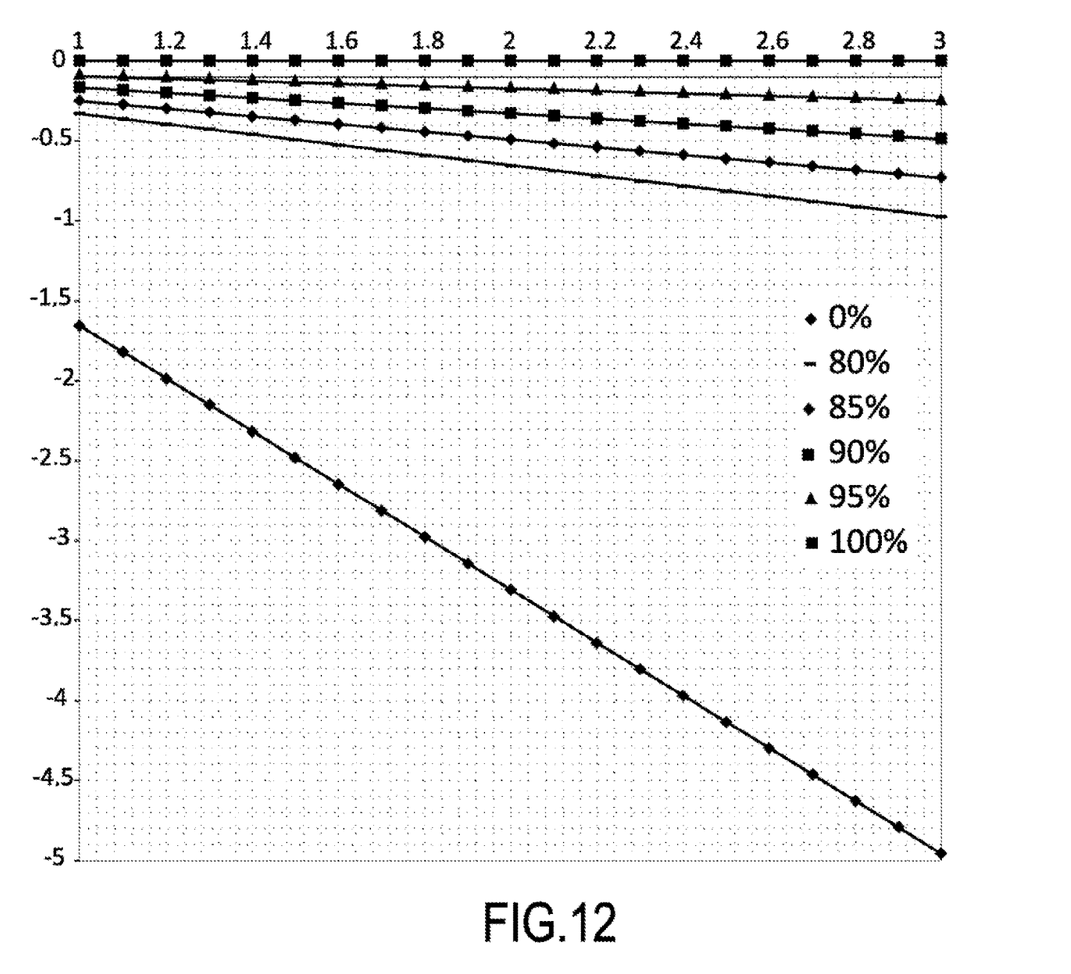
FIG. 12 is a graph showing the phase difference between the current that is to be measured and the current that is measured for various values of the protective resistance of the FIG. 10 current measuring device.

FIG. 12 shows a set of curves plotting along the ordinate axis the phase difference in degrees between the current $I_1$ to be measured and the measured current for different values of R satisfying the relationship $R=y(R_l+R_B)$ for the protective resistance 7 of the current measuring device, with $R_l$ being 8.5Ω and $R_b$ being 3Ω. The capacitance of the capacitor is plotted along the abscissa in microfarads. Each curve shows the phase difference as a function of the capacitance of the capacitor for a different value of y. The value of y is expressed as a percentage in the legend of FIG. 12 (0%, 80%, 85%, 90%, 95%, 100%). The curve with y=0% corresponds to a circuit that does not include the resistance 7 (the value of R is zero).

It can be seen that for the coefficient y having a value greater than 80% (y>0.8), which corresponds to having knowledge of $R_J+R_B$ to within better than 20%, a significant improvement is obtained in terms of phase difference. The phase difference is significantly reduced compared with a conventional solution of the prior art using a current transformer and a capacitor on its own, which corresponds to the curve for y=0.

For the windings of the magnetic toruses 2 and 3 having a resistance of 12Ω, the protective resistance 7 having a resistance R of 11.5Ω, the number of turns $N_1$ and $N_2$ of each of the first and second magnetic toruses 2 and 3 equal to 1500 turns, and a current that is to be measured $I_{1rms}$ of 260 amps (A), the current measuring device 1 presents, in nominal operation, i.e. when the load resistance 6 is properly connected, power losses that are reduced since they are of the order of 1.06 W that is distributed as follows: 0.34 W via the protective resistance 7 and 0.36 W via each of the two magnetic toruses 2 and 3. With the same operating parameters, and when operating with the load resistance 6 disconnected, the current measuring device 1 presents power losses that are likewise reduced for fault operation since they are of the order of 2.1 W that is distributed as follows: 1.38 W via the protective resistance 7 and 0.36 W via each of the two magnetic toruses 2 and 3.

Thus, in the particular event of the current measuring device 1 failing as a result of the current transformer being open circuit, the device 1 of the invention presents smaller losses than does a prior art solution, e.g. using a peak-limiter.

In other embodiments, the current branch connection means may be other than a capacitor. For example, said means may be a tranzorb, or a peak-limiter, or indeed a series connection of two zener diodes connected opposite ways round, or indeed a parallel connection of a first branch having a number k of diodes connected in series to conduct in a first direction and a second branch comprising the same number k of diodes connected in series to conduct in a second direction opposite to the first direction.

Figure 13:
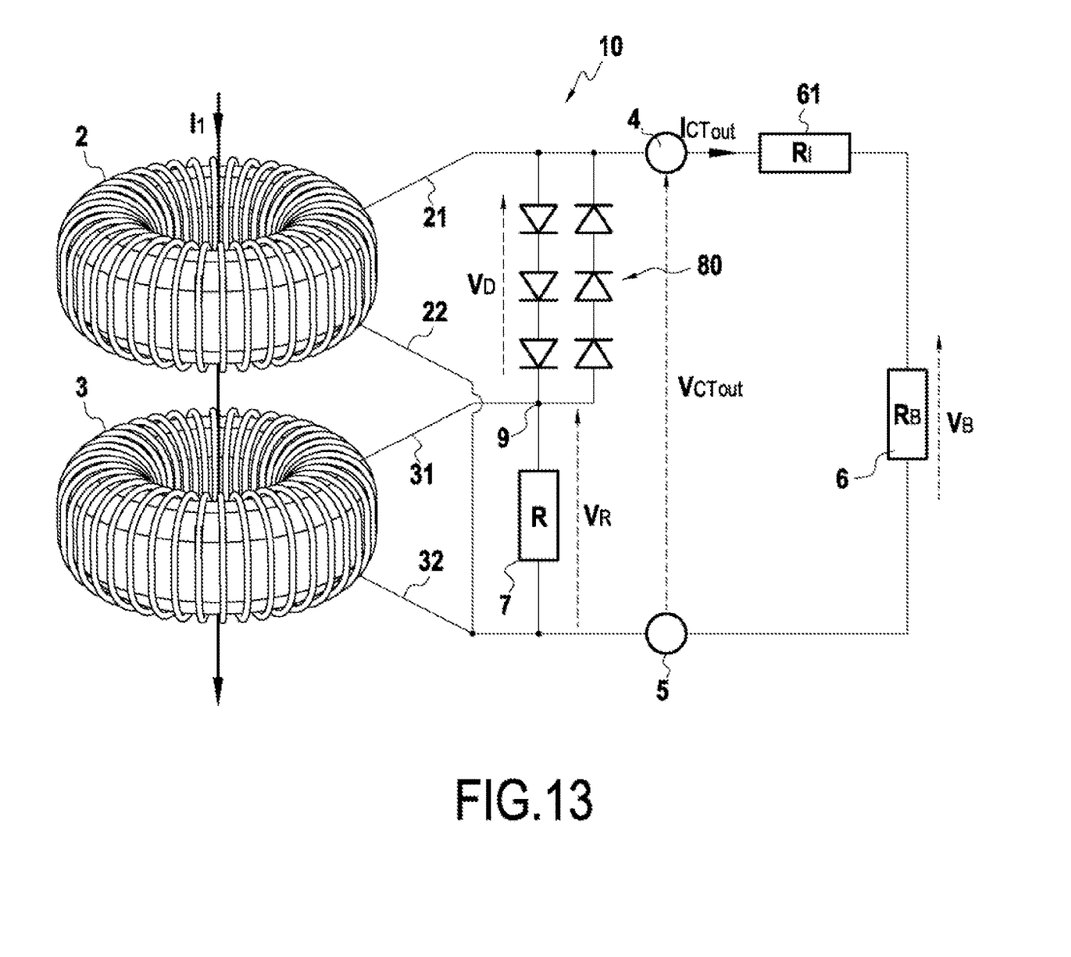
FIG. 13 is a schematic diagram of a current measuring device in a second embodiment of the invention.

FIG. 13 is a circuit diagram of an electrical circuit of a current measuring device in a second embodiment of the invention.

Elements of the current measuring device 10 that are identical to the current measuring device 1 of the first embodiment shown in FIG. 10 are given the same numerical references.

The current measuring device 10 in the second embodiment differs from the current measuring device 1 in the second embodiment shown in FIG. 10 in that the capacitance 8 forming the current branch connection means has been replaced by a parallel circuit comprising a first branch of three diodes connected in series to conduct in a first direction and a second branch likewise comprising three diodes connected in series but to conduct in a second direction opposite to the first direction.

Since the value R of the protective resistance 7 is selected to be as close as possible to the sum of the value $R_J$ of the line impedance 61 plus the value $R_B$ of the load resistance 6, in nominal operation of the current measuring device 10, the voltage across the terminals of the diodes is not sufficient for them to conduct.

Thus, no additional measurement error results from this embodiment.

In the event of the load resistance 6 being disconnected, the measurement current $I_2$ forces three diodes to conduct in the direction in which current flows in the secondary winding of the first magnetic torus 2.

The number k of diodes to be connected in series in each branch of the current branch connection means in the second embodiment is given by the following relationship:

$$k > (1-y)\frac{I_1}{nV_{thres}}(R_1 + R_B)$$

For the windings of the magnetic toruses 2 and 3 having a resistance of 12Ω, the protective resistance 7 having a value R of 11.5Ω, each of the first and second magnetic toruses 2 and 3 having a number $N_1$ and $N_2$ of turns equal to 1500, and a current that is to be measured $I_{1rms}$ of 260A, the current measuring device 1 in nominal operation, i.e. when the load resistance 6 is correctly connected, presents power losses that are small, since they are of the order of 1.06 W, which is equal to the losses in nominal operation of the current measuring device in the first embodiment. Using the same operating parameters, and operating with the load resistance 6 disconnected, the current measuring device 1 presents power losses that are likewise small for fault operation since they are about 2.725 W distributed as follows: 1.38 W via the protective resistance 7, 0.36 W via each of the magnetic toruses 2 and 3, and 0.625 W via the diode connection.

Thus, in the event of the current measuring device 10 failing, in particular by causing the current transformer to be open circuit, the device 10 of the invention likewise presents losses that are smaller than in a prior art solution, e.g. using a peak-limiter.

Protecting a CT against electrical surges in the event of the secondary circuit being open circuit has a cost, in particular in terms of weight. The conventional solutions described above show that if a circuit is to be capable of withstanding that type of fault on a permanent basis, it is necessary at least to double the weight of the measuring means, and thus potentially also its price, in particular because of the heat energy dissipation means that need to be provided.

The subject matter of the invention that is proposed also doubles the price and the weight of a conventional unprotected CT. Nevertheless, it provides all of the following advantages together:

protection for operators in the event of a CT fault, in particular in the event of the secondary circuit of the CT being open circuit;

compatibility with a carbon fiber structure airplane concerning the minimum current thresholds of faults that are to be detected; and ability to withstand a CT fault on a permanent basis.

These solutions can be envisaged for three-phase networks having powers greater than 90 kVA, which is not necessarily true of solutions making use of peak-limiters, which are limited by the power that can be dissipated.

The weight saving due to a "carbon-fiber" airplane can justify the increase in the weight and the cost of this solution, it being understood that it is the only solution compatible with the requirement for accuracy associated with this new "carbon-fiber" technology and it also provides effective protection in the event of a fault both for an operator and for the equipment in which it is installed.

The invention claimed is:

1. A current measuring device that is protected against electrical surges when opening an electric circuit of said device, said device comprising:
   a first current transformer,
   a first connection terminal having connected thereto a first terminal of said first current transformer,
   a second connection terminal having connected thereto a second terminal of said first current transformer distinct from said first terminal of said first current transformer,
   a protective resistance having a first terminal connected to said second connection terminal,
   a load resistance connected between said first and second connection terminals across terminals of which a voltage is measured from which a current flowing in a circuit passing through said first current transformer is determined,
   a first terminal of a second current transformer connected to a second terminal of said protective resistance and a second terminal of said second current transformer connected to said first terminal of said protective resistance,
   said circuit also passing through said second current transformer, and
   current branch connection means connected between said first connection terminal and said second terminal of said protective resistance.

2. The device according to claim 1, wherein the protective resistance possesses a resistance value corresponding, to within 20% to a sum of a resistance value of the load resistance plus a resistance value $l$ of a line impedance corresponding to a resistance of an electric line coupling the load resistance to the first and second connection terminals.

3. The device according to claim 1, wherein the first and second current transformers are identical magnetic toruses possessing the same magnetic cores and the same number of turns.

4. The device according to claim 1, wherein the current branch connection means comprise a capacitor.

5. The device according to claim 1, wherein the current branch connection means comprise peak-limiter means.

6. The device according to claim 1, wherein the current branch connection means comprise a parallel connection having a first branch with a number k of diodes connected in series to conduct in a first direction and a second branch comprising the same number k of diodes connected in series to conduct in a second direction opposite to the first direction.

7. The device according to claim 1, wherein the current branch connection means comprise a series connection of two zener diodes connected opposite ways round.

8. The device according to claim 1, further comprising a fault detection device for detecting a fault in the current measuring device for measuring the voltage across the terminals of the load resistance.

9. A three-phase measurement system for measuring current flowing in the three-phases of a three-phase circuit, the system comprising;
   three of the devices according to claim 1, the second connection terminals of the devices being connected together.

10. An aircraft comprising:
    at least one of the device according to claim 1.

11. The device according to claim 2, wherein the resistance value of the protective resistance is within 10%.

12. The device according to claim 5, wherein the peak-limiter means include a tranzorb.

* * * * *